(12) United States Patent
Yang

(10) Patent No.: US 6,218,082 B1
(45) Date of Patent: Apr. 17, 2001

(54) METHOD FOR PATTERNING A PHOTORESIST

(75) Inventor: Hyun-Jo Yang, Choongcheongbuk-Do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/146,257

(22) Filed: Sep. 3, 1998

(30) Foreign Application Priority Data

Jan. 14, 1998 (KR) .................................................... 98/819

(51) Int. Cl.$^7$ ........................................................ G03F 7/26
(52) U.S. Cl. ............................................. 430/325; 430/330
(58) Field of Search ..................................... 430/311, 313, 430/322, 325, 324, 330

(56) References Cited

U.S. PATENT DOCUMENTS 5,650,261 * 7/1997 Winkle ............................... 430/270.1
5,814,432 * 9/1998 Kobayashi ............................ 430/312
6,107,002 * 8/2000 Holscher ............................... 430/313

OTHER PUBLICATIONS

H. Ito, "Chemical amplification resists: History and development within IBM;" IBM Journal of Research & Development, vol. 41, No. 1/2–Optical lithography.

* cited by examiner

Primary Examiner—Kathleen Duda
(74) Attorney, Agent, or Firm—Fleshner & Kim, LLP

(57) ABSTRACT

A method for patterning a chemical amplification photoresist includes the steps of applying a photoresist film on a surface of a semiconductor substrate, exposing the photoresist film to light in an exposing apparatus, and subjecting the substrate and the photoresist to an alkaline gas having over 20 ppb for a predetermined period of time. The gas exposure step removes undesired hydrogen ions from non-exposure portions of the photoresist so that unnecessary patterns are not formed on the photoresist. For instance, the method prevents the formation of a side lobe, when fine patterns on a half-tone phase shift photomask are closely packed. Therefore the method improves a reliability of a semiconductor device.

21 Claims, 7 Drawing Sheets

METHOD FOR PATTERNING A PHOTORESIST

BACKGROUND OF THE INVENTION

1. Field of the Invention

The present invention relates to methods of forming a semiconductor device, and more particularly to a method for patterning a photoresist.

2. Background of the Related Art

As semiconductor devices have become highly-integrated, lithographic techniques capable of achieving a critical dimension of less than 0.25 µm have become necessary. In order to improve a resolution of such a thin pattern, it is necessary to improve both the mask and the photoresist.

After a phase shift mask was first developed by Levenson in 1982, various studies for improving the phase shift mask have been carried out. Unfortunately, the Levenson-type or attenuation-type phase shift mask has no defect detecting equipment. Thus, it is difficult to use it for an actual semiconductor manufacturing process.

Recently, a half-tone phase shift mask has been widely used for semiconductor manufacturing processes. Because defect detecting equipment is available for a half-tone phase shift mask, it is possible to use it in an actual manufacturing process.

There have also been a number of studies about lithographic processes using a deep-UV exposure light having a wavelength of 200 to 300 nm. A new photoresist corresponding to the deep-UV exposure light was required, and IBM first developed a chemical amplification photoresist. The term "photoresist" refers to high polymer resins which form patterns by using the difference between dissolution of an exposed portion and of a non-exposed portion. The difference in dissolution properties are formed by a chemical reaction due to light exposure.

A method of forming a pattern using a background art half-tone phase shift mask and a chemical amplification photoresist will be now described with reference to FIGS. 1–6.

FIG. 1 is a vertical cross-sectional view of a background art half-tone phase shift mask. As shown therein, a substrate 1 is formed of an optically transparent material, and a semipermeable film 2 formed of chrome is formed on the substrate 1. A phase shift film 3 formed of silicon dioxide is formed on the semipermeable film 2. The semipermeable film 2 allows approximately 5 to 10% of incident light to pass there through. A portion in which the semipermeable film 2 is covered by the phase shift film 3 is a phase shift region or non-exposure region 4. A portion in which the substrate 1 is externally exposed is a light transmitting or exposure region 5.

FIG. 2 illustrates the phase and amplitude of light transmitted through the phase shift mask shown in FIG. 1. This is the light that would reach a chemical amplification photoresist formed on a substrate. Specifically, the light corresponding to the phase shift region 4 has a negative phase and a relatively low amplitude. The light corresponding to the light transmitting region 5 has a positive phase and a relatively large amplitude.

FIG. 3 illustrates only the intensity of the light transmitted through the phase shift mask in FIG. 1. The light corresponding to the light transmitting region 5 has an amplitude close to 1, and the light corresponding to the phase shift region 4 has an amplitude close to 0.

FIG. 4 is a vertical cross-sectional diagram of a photoresist pattern 20, having patterns with dimensions larger than 0.25 µm, formed using the phase shift mask of FIG. 1. FIG. 5 is a plan view illustrating the photoresist pattern 20 on the semiconductor substrate 10 in FIG. 4.

The photo-resist pattern 20 is formed by allowing light passing through the phase shift mask in FIG. 1 to reach a photoresist film applied on a semiconductor substrate 10. The exposed photoresist film is then developed with a developing solution. The portions of the photoresist film below the light transmitting regions 5 of the phase shift mask in FIG. 1 are exposed to light and changed such that the exposed portions can be dissolved by the developing solution. The portions of the photo-resist below the phase shift regions 4 are not exposed to the light, thus they are not able to be dissolved in the developing solution. Accordingly, when the semiconductor substrate 10 with the exposed photo-resist layer is put into the developing solution, which is typically an alkaline solution, the portion of the photoresist film below the light transmitting region 5 is dissolved and removed, thus forming the photoresist pattern 20 shown in FIG. 4. The photoresist pattern shown in FIGS. 4 and 5 is what one ideally wants to achieve. Unfortunately, when the feature dimensions become quite small, for instance, on the order of 0.25 µm, problems can occur.

FIG. 6 is a flow chart showing the steps of a background art method of forming a photoresist pattern having dimensions larger than 0.25 µm. First, in step 61, a wafer is provided into a processing track and a photoresist layer is coated on the wafer in step 62. The photoresist is cured by conducting a soft bake process in step 63. The wafer is then cooled down in step 64. Next, the wafer is put into an exposing apparatus, such as a stepper, and exposed to light using a half-tone phase shift mask in step 65. A post expose bake process is conducted with the resultant wafer in step 66. The wafer is then put into an alkaline developing solution to be developed, thereby removing the exposed portions thereof and forming a photoresist pattern in step 67. A hard bake process is then conducted with the wafer, thereby curing the photoresist pattern in step 68. Finally, the process for forming the photoresist pattern is completed by extracting the wafer from the track in step 69.

A chemical amplification photoresist is typically used in the process described above. The chemical amplification photoresist will often, include a novolak resin, a photo acid generator (PAG), a sensitizer, and a dissolution inhibitor. When such a photoresist is exposed to light, the PAG generates hydrogen ions ($H^+$). Further, when the post exposure baking process is conducted at about 100° C. for 30 minutes, the number of hydrogen ions rapidly increases and they diffuse into the photoresist, thus disconnecting links of the dissolution inhibitor. As the links of the dissolution inhibitor are disconnected, additional hydrogen ions are generated, and the generation of hydrogen ions is further amplified. This is why the photoresist is called a chemical amplification photoresist. When the links of the dissolution inhibitor are completely disconnected, the photoresist may be dissolved by an alkaline developing solution, such as tetramethyl amonium hydroxide (TMAH), thus forming the photoresist pattern.

When a chemical amplification photoresist is used in combination with a half-tone phase shift mask having extremely small dimensions, such as on the order of 0.25 µm, and when opening patterns in the half-tone phase shift mask are formed adjacent each other photosensitization may occur, and some of the exposing light may penetrate the chrome light blocking portions. The light penetrating the light blocking portions partially exposes the underlying photoresist. This, in turn, will cause a portion of the photoresist which should not be removed to be partially etched during subsequent development steps. Thus, a side lobe in an undesired portion of the photoresist is opened.

FIG. 7A is a plan view of a photoresist film in which a side lobe 30a appeared when the photoresist film was exposed to light and developed using a half-tone phase shift mask as shown in FIG. 1 having very small feature dimensions. FIG. 7B is a vertical cross-sectional diagram of the photoresist pattern shown in FIG. 7A taken along section line VIIb—VIIb. In FIGS. 7A and 7B, a photoresist pattern 20, includes opening portions 30, and a side lobe 30a.

A clean room for fabricating a semiconductor device is typically provided with a processing track in which the process steps for forming the semiconductor device are actually conducted. An interface is provided for a person who works to manufacture the device. A photoresist patterning process is conducted in the track.

An atmosphere in the track is more filtered than that of the interface, thus lowering a density or concentration of particles and gases which are harmful to the semiconductor device manufacturing process. In the typical process for patterning a conventional chemical amplification photoresist, a density of alkaline gas such as $NH_3$ in the track is controlled so that it remains under 1 ppb (parts per billion). This is usually achieved through a chemical filtering process. However, a density or concentration of the alkaline gas in the interface may be as high as approximately 20 to 50 ppb.

When a chemical amplification photoresist layer which has been exposed to patterning light using a mask is then exposed to a relatively high density alkaline gas such as $NH_3$, for example above 50 ppb, the alkaline gas is neutralized by combining with the hydrogen ions generated in the photoresist at a surface thereof in response to the exposure light. The combination of hydrogen ions with the alkaline gas prevents the links of the dissolution inhibitor from being disconnected. Consequently, an exposed portion of the photoresist remains insoluble due to the continued presence of the dissolution inhibitor. Thus it is impossible to form the photoresist pattern. This is the reason why the density of the alkaline gas should remain under 1 ppb inside the processing track.

SUMMARY OF THE INVENTION

The present invention is directed to a method for patterning a photoresist that obviates the problems described above.

It is an object of the present invention to provide a method for patterning a photoresist using a half-tone phase shift mask and a chemical amplification photoresist that does not result in formation of a side lobe.

In a method embodying the invention, a chemical amplification photoresist is exposed using a half-tone phase shift mask, and the photo-resist is then exposed to an alkaline gas having a controlled density or concentration for a predetermined period of time. This process helps to eliminate the presence of hydrogen ions in non-exposed portions of the photoresist that were not intended to be exposed, thereby eliminating side lobes. The elimination of side lobes, in turn, improves the reliability of the semiconductor device.

A method for patterning a photoresist according to the invention may include the steps of: providing a wafer in a semiconductor processing track; applying a chemical amplification photoresist on an upper surface of the wafer; conducting a baking process; exposing the chemical amplification photoresist to light using a half-tone phase shift mask; exposing the wafer to alkaline gas having a predetermined density; and developing the photoresist pattern with a developing solution.

The step of exposing the photo-resist pattern to an alkaline gas can be accomplished by placing the substrate and exposed photoresist layer in a chamber containing the alkaline gas, or the substrate could be moved from the processing track into an interface area having the alkaline gas.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements, and wherein.

DETAILED DESCRIPTION OF PREFERRED EMBODIMENTS

Figure 1:
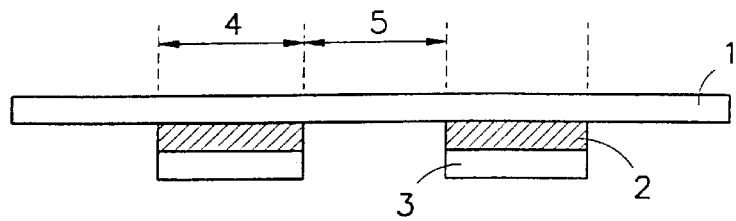
FIG. 1 is a vertical cross-sectional diagram of a background art half-tone phase shift mask.
Figure 2:
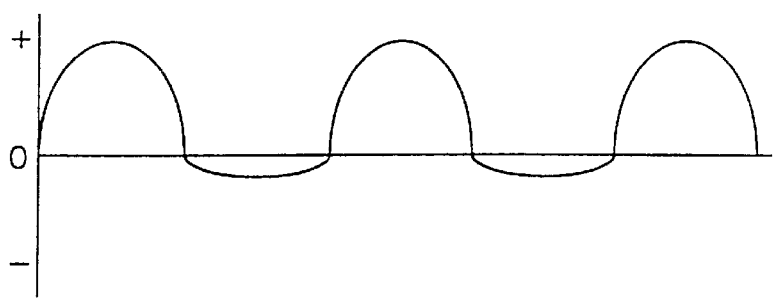
FIG. 2 is a graph illustrating the phase and amplitude of light transmitted through the phase shift mask shown in FIG. 1.
Figure 3:
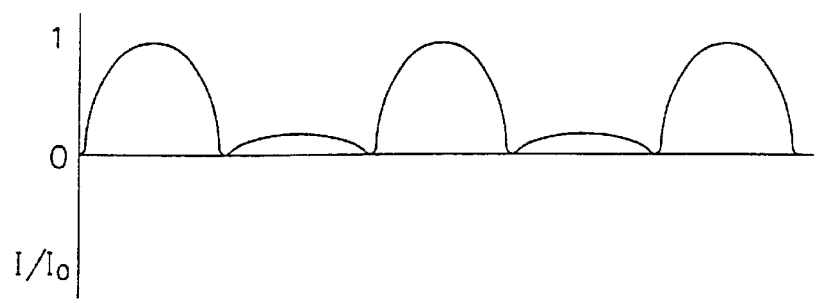
FIG. 3 is a graph illustrating a light intensity of the light in FIG. 2.
Figure 4:
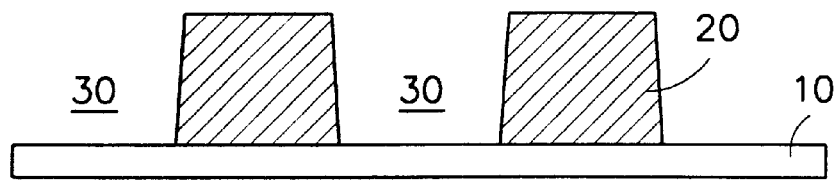
FIG. 4 is a vertical cross-sectional diagram of a semiconductor substrate and a well formed photoresist pattern having relatively large feature dimensions after the photoresist film has been developed.
Figure 5:
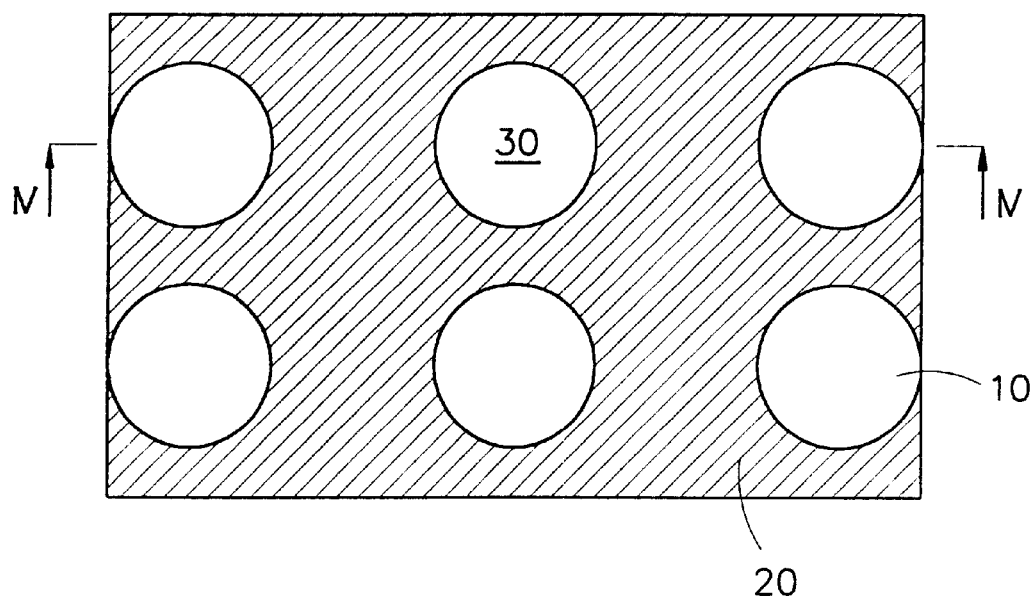
FIG. 5 is a plan view of the semiconductor substrate and photoresist pattern shown in FIG. 4.
Figure 6:
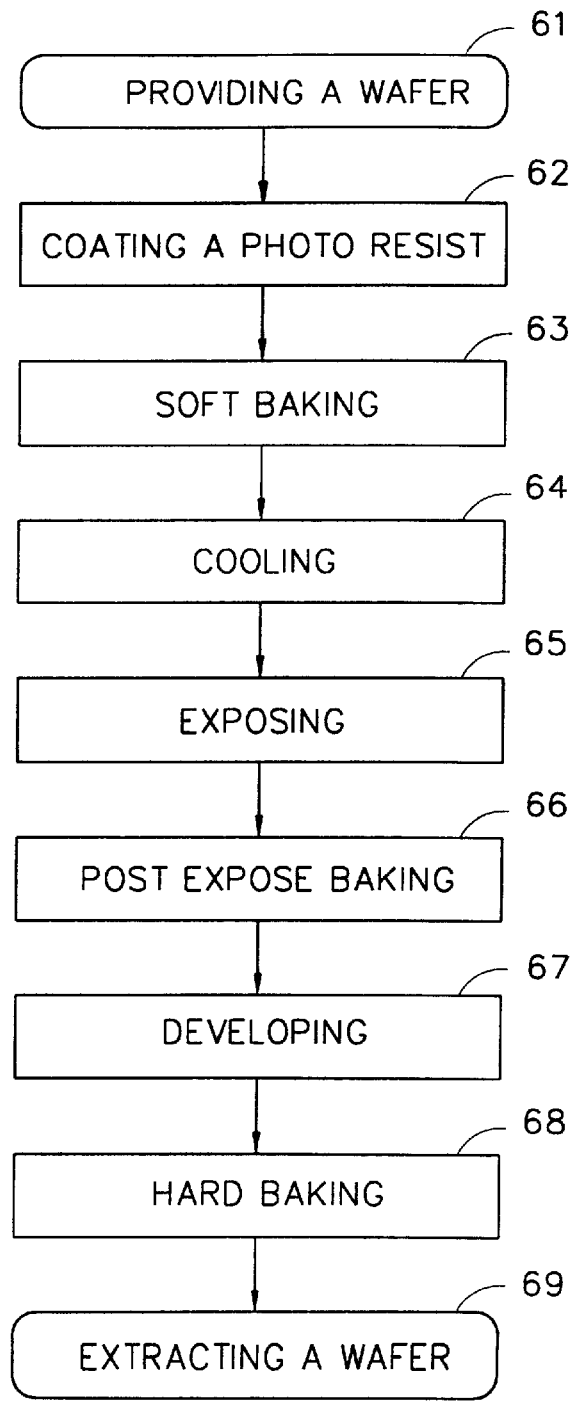
FIG. 6 is a flowchart showing the steps of a background art method of forming a photoresist pattern.
Figure 7A:
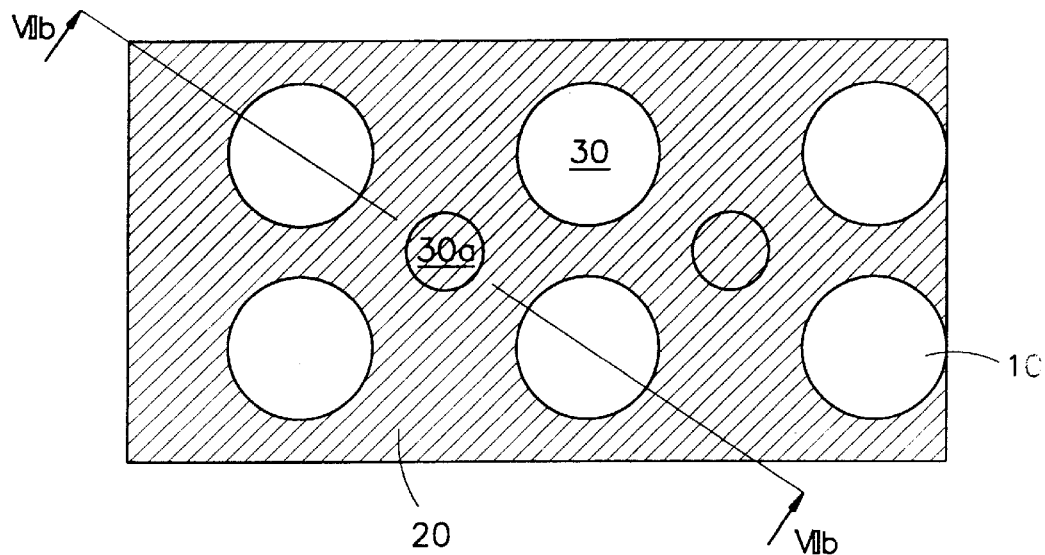
FIG. 7A is a plan view of a semiconductor substrate on which a photoresist pattern having a side lobe is formed.
Figure 7B:
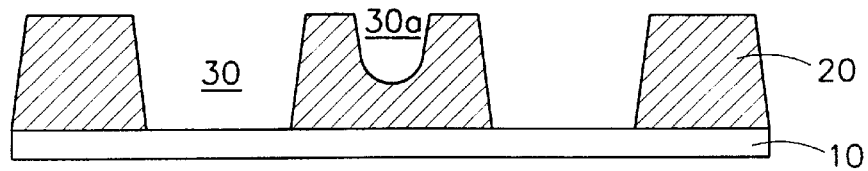
FIG. 7B is a vertical cross-sectional view of the substrate and photoresist pattern shown in FIG. 7A, taken along the line VIIb—VIIb.
Figure 8:
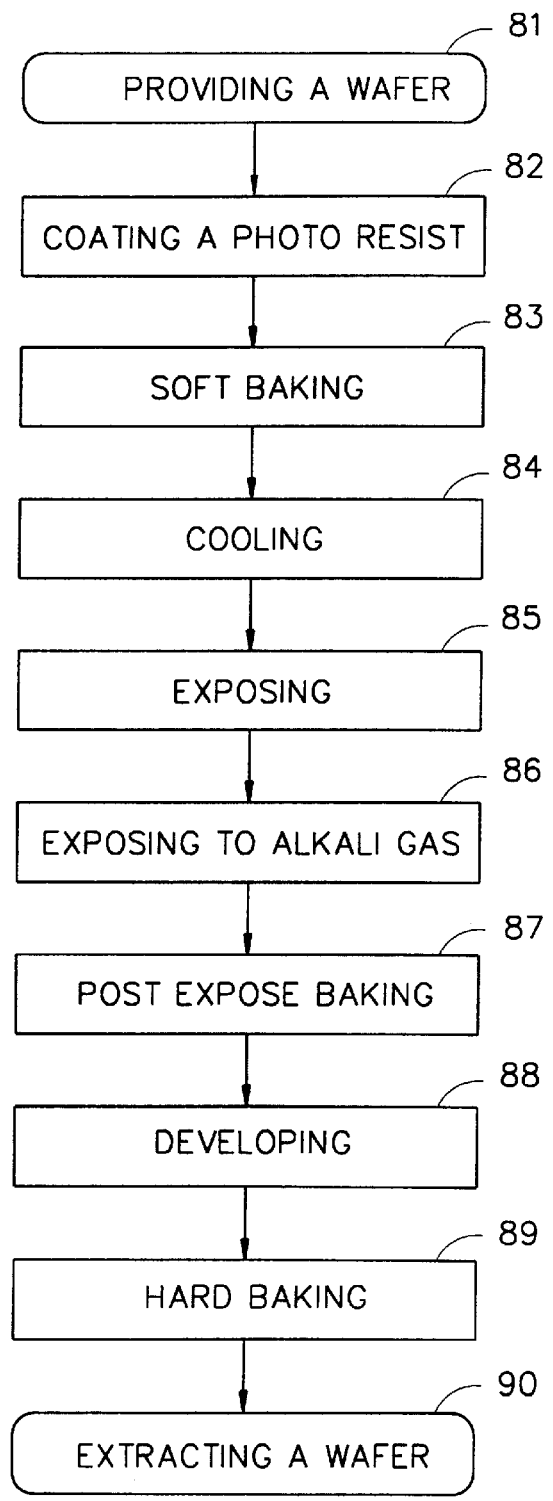
FIG. 8 is a flowchart of a method of patterning a photoresist according to the present invention.

FIG. 8 is a flowchart showing steps of a method of patterning a photoresist according to the present invention. As shown therein, in step 81, a wafer is provided in a track in which a density or concentration of an alkaline gas is controlled such that it is under 1 ppb. A photoresist is then applied on an upper surface of the wafer in step 82.

In step 83, a soft baking process is then conducted, thereby curing the photoresist. The wafer is then cooled in step 84.

Next, in step 85, the wafer is put into an exposing apparatus, such as a stepper, and the photoresist layer is exposed to light, using a half-tone phase shift mask. In step 86, the resultant wafer is then exposed to alkaline gas, such as NH$_3$, having a density or concentration of approximately 20–50 ppb for about 5 minutes. Since the density of the alkaline gas is same as that of an interface in a clean room, step 86 may be achieved by simply taking the wafer from the track and placing in the interface. Because there is no need to provide any new equipment to perform such a step, no additional capital costs need be incurred to practice of the present invention.

In an alternative method, when an alkaline gas having a density or concentration of 20–50 ppb is required for a process according to the present invention, a reaction chamber having such an alkaline gas can be provided in the track. The wafer would be put into the reaction chamber for few minutes to accomplish step 86.

Next, in step 87, a post exposure baking process is conducted on the wafer. The wafer is then developed in an alkaline developing solution in step 88 to remove an exposed portion of the wafer and to form a photoresist pattern.

The formed photoresist pattern is then cured in step 89 by conducting a hard baking process on the wafer. The wafer is then extracted from the track in step 90, thereby completing the process for patterning the photoresist according to the present invention.

Figure 9A:
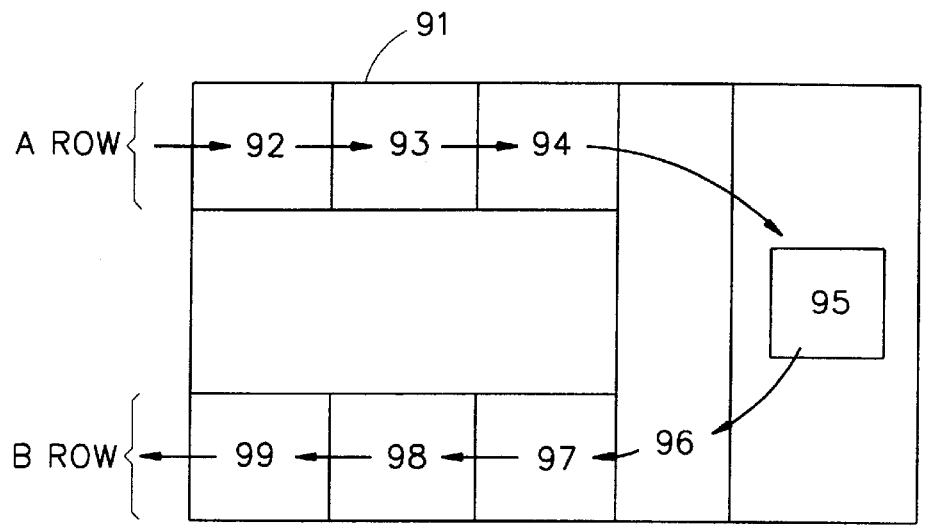
FIG. 9A is a diagram of a system for forming a photoresist pattern according to the present invention.

FIG. 9A is a diagram of a system that can be utilized for forming a photoresist pattern according to the present invention. A track 91, includes a coater 92, a soft baking plate 93, and a cooling plate 94 along row A. On the other side of the system, from right to left, the system includes a post exposure baking plate 97, a developing processor 98, and a hard baking plate 99 along row B. In addition, an interface 96 and a stepper 95 is disposed on the right side of the track 91. An atmosphere of the stepper 95 is identical to that of the track 91. The arrows in FIG. 9A indicate a flow of the wafer through the different stations of the system.

In a clean room equipped with the system shown in FIG. 9A, a photoresist is applied on an upper surface of a wafer by the coater 92. The photoresist is cured by the soft baking plate 93, and is then cooled down by the cooling plate 94. Then, the photoresist is exposed to light by the stepper 95, and exposed to alkaline gas of 20–50 ppb for few minutes. The exposed wafer is then transferred back into the track 91. The photoresist is cured by the post exposure baking plate 97, and then developed by the developing processor 98. This process forms a photoresist pattern on the water. The photoresist pattern is again cured by the hard baking plate 99, and the resultant wafer is extracted from the track 91.

Figure 9B:
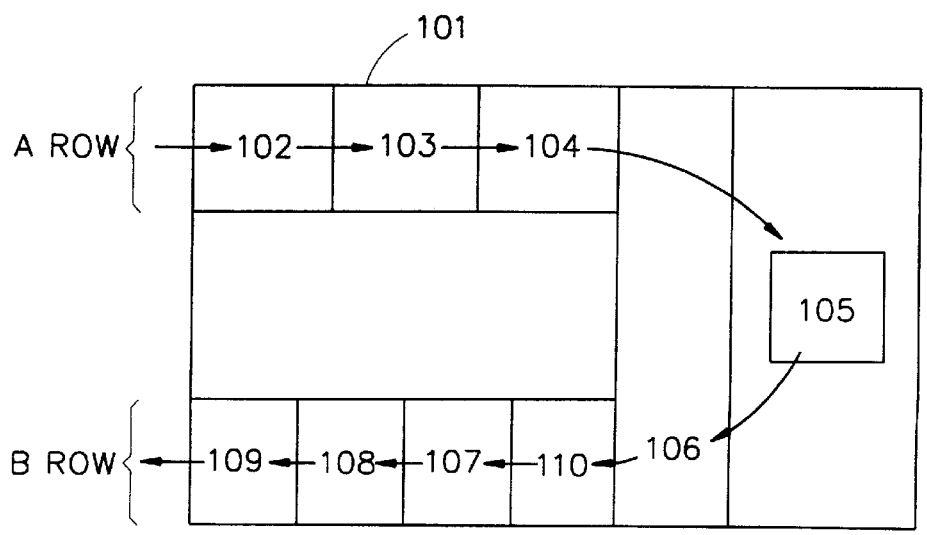
FIG. 9B is another diagram of a system for forming a photoresist pattern according to the present invention.

FIG. 9B is an another diagram showing an alternate system for forming a photoresist pattern according to the present invention. As shown therein, in a track 101, there are provided a coater 102, a soft baking plate 103, and a cooling plate 104 on a row A. On the other side of the system, from right to left, the system includes an alkaline gaseous reaction chamber 110, a post exposure baking plate 107, a developing processor 108, and a hard baking plate 109 on a row B. In addition, an interface 106 and a stepper 105 is disposed on one side of the track 101. An atmosphere at the stepper 105 is identical to that of the track 101. The arrows, in FIG. 9B indicate a flow of the wafer through the stations of the system.

In a clean room equipped with the system shown in FIG. 9B, a photoresist is first applied on an upper surface of a wafer by the coater 102. The photoresist is then cured by the soft baking plate 93, and cooled by the cooling plate 104. Then, the photoresist is exposed to light by the stepper 105, and the wafer is transferred back into the track 101. The wafer is then exposed to an alkaline gas for few minutes in the alkaline gaseous reaction chamber 110. The photoresist formed on the upper surface of the wafer is cured by the post exposure baking plate 107, and is then developed by the developing processor 108. The photoresist pattern is cured by the hard baking plate 109, and the resultant wafer is extracted from the track 101.

An explanation of how a method embodying the invention is capable of removing a side lobe will be described in conjunction with FIGS. 10A–10C. First, the chemical amplification photoresist comprises a novolak resin, a photo acid generator (PAG), and a sensitizer which is a dissolution inhibitor. When the photoresist is exposed to light, the PAG generates hydrogen ions (H$^+$). Further, when the post exposure baking process is conducted at about 100° C. for 30 minutes, the number of hydrogen ions rapidly increases and the ions diffuse into the photoresist. The hydrogen ions disconnect links of the dissolution inhibitor.

In a half-tone phase shifting photomask having closely formed patterns, the intensity of light passing through the chrome layer, which is supposed to be close to 0, becomes slightly stronger due to photosensitization. As a result, generation of hydrogen ions occurs even at a surface of the photoresist directly below the light blocking chrome portions. If these hydrogen ions remain on the photoresist, the developing process will cause formation of side lobes at portions of the photoresist corresponding to the location of the light blocking chrome portions of the mask.

Accordingly, in order to remove hydrogen ions formed in an undesired area, the wafer is exposed to an alkaline gas for an amount of time necessary to neutralize the hydrogen ions formed at the surface of the photoresist, and on a surrounding area thereof. Therefore, hydrogen ions generated in a portion of the photoresist which was not intended to be exposed are neutralized and removed. Thus, the portion which should not be removed is not dissolved by the developing solution, and an precise pattern is formed. However, if the wafer is overexposed to the alkaline gas, a portion of the photoresist that was intended to be exposed and removed might be also neutralized. Thus, careful attention should be paid to the amount of time the substrate is exposed to the alkaline gas.

Figure 10A:
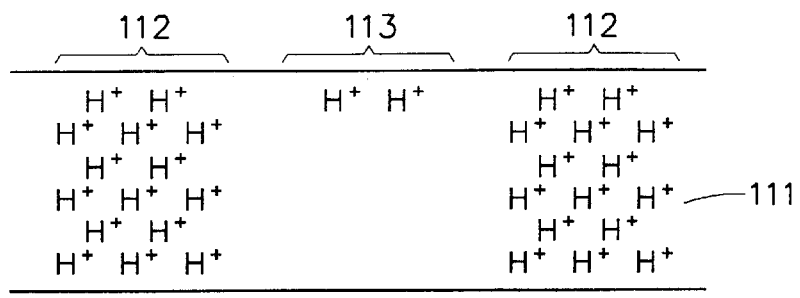
FIGS. 10A, 10B and 10C illustrate the results of fabrication steps of a chemical amplification photoresist patterning process according to the present invention.
Figure 10B:
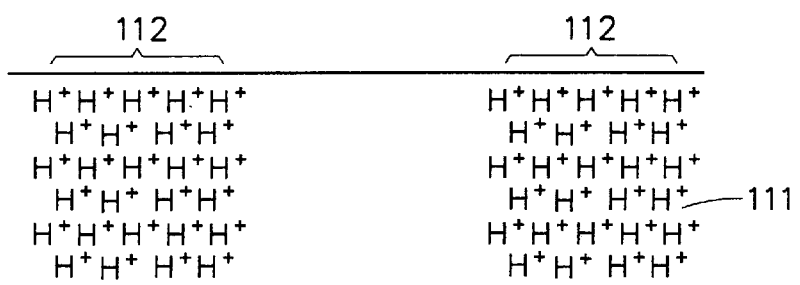
Figure 10C:
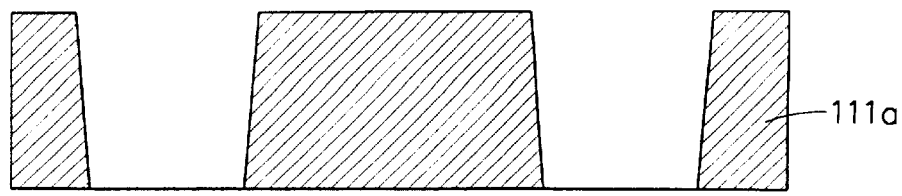

FIGS. 10A–10C are vertical cross-sectional diagrams illustrating fabrication of a chemical amplification photoresist pattern according to the present invention. In FIGS. 10A–10C, 111 is a photoresist layer, 112 is a portion positioned below light transmitting regions of photomask which is exposed to light, and 113 corresponds to a light blocking portion where a side lobe may be generated. FIG. 10A shows a state of the photoresist 111 after an exposure operation has been performed. As shown therein, many hydrogen ions are formed in the light exposed portions 112 of the photoresist 111. However, in the portion 113, hydrogen ions are formed only at the surface of the photoresist 111.

Next, the wafer is exposed to an alkaline gas for a predetermined period of time. This neutralizes the hydrogen ions formed at the surface of the photoresist 111 corresponding to portion 113, and the hydrogen ions formed at the portion 113 are removed, as shown in FIG. 10B. Thereafter, when a baking process is conducted, the number of hydrogen ions rapidly increases in the exposed portions 112 of the photoresist 111 below the light transmitting regions of the photomask. The portions 112 can then be removed by being dissolved in a developing solution, thus forming the photoresist pattern 111a shown in FIG. 10C.

As described above, a method embodying the present invention has an advantage of improving a reliability of a semiconductor device by preventing the formation of side lobes. The method can utilize a half-tone phase shift mask to pattern a chemical amplification photoresist in a deep-UV lithography process in order to form the critical dimensions of a semiconductor pattern is under 0.25 μm.

It will be apparent to those skilled in the art that various modifications and variations can be made in the above-described methods for patterning a photoresist without departing from the spirit or scope of the invention. Thus, it is intended that the present invention cover the modifications and variations of this invention provided they come within the scope of the appended claims and their equivalents.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A method for making a prescribed pattern in a photoresist layer on a substrate, comprising:

exposing prescribed portions of the photoresist layer to light, wherein said prescribed portions include regions for forming said prescribed pattern;

exposing the photoresist layer to an alkaline gas having a concentration above 1 ppb for a predetermined period of time after exposing the prescribed portions; and removing the prescribed portions of the photoresist layer exposed to the light to form the prescribed pattern.

2. The method of claim 1, wherein the alkaline gas exposure step comprises exposing the photoresist layer to an $NH_3$ gas.

3. The method of claim 1, wherein the removing step comprises the steps of:

conducting a first baking process; and developing the prescribed pattern of the photoresist layer.

4. The method of claim 3, wherein the developing step is performed using one of an alkaline solution and a tetramethyl amonium hydroxide (TMAH).

5. The method of claim 1, further comprising the steps of:

applying the photoresist layer on the substrate; and conducting a baking process, wherein the applying step and baking step are performed before the light exposure step, and are performed in a track in which a concentration of an alkaline gas is less than approximately 1 ppb.

6. The method of claim 1, wherein the alkaline gas exposure step comprises exposing the photoresist layer to an alkaline gas having a concentration of more than approximately 20 ppb.

7. The method of claim 1, wherein the alkaline gas exposure step comprises placing the photoresist layer formed on the substrate in an interface of a clean room.

8. The method of claim 1, wherein the alkaline gas exposure step comprises placing the photoresist layer formed on the substrate in a reaction chamber.

9. The method of claim 1, wherein the alkaline gas exposure step comprises exposing the photoresist layer to the alkaline gas for a predetermined period of time necessary to neutralize hydrogen ions formed on a surface of the photoresist layer.

10. The method of claim 1, wherein the alkaline gas exposure step comprises exposing the photoresist layer to an alkaline gas having a concentration of approximately 20–40 ppb for approximately 5 minutes.

11. A method of forming a photoresist pattern on a substrate, comprising:

applying a photoresist to a substrate;

forming exposed and non-exposed portions on the photoresist, wherein the exposed portions include an area for forming the photoresist pattern;

neutralizing hydrogen ions generated in areas of the photoresist by exposing the photoresist to an alkaline gas for a prescribed period of time after the forming step; and removing the exposed portions of the photoresist to form the photoresist pattern.

12. The method of claim 11, wherein the forming step comprises conducting a light exposure operation using a half-tone phase shifting mask.

13. The method of claim 11, wherein the neutralizing step comprises exposing the photoresist to an $NH_3$ gas.

14. The method of claim 11, wherein the neutralizing step comprises moving the substrate and photoresist to one of an interface and a reaction chamber.

15. The method of claim 11, wherein the neutralizing step comprises exposing the photoresist to the alkaline gas for a predetermined period of time necessary to substantially neutralize hydrogen ions formed at the non-exposed portions of the photoresist.

16. The method of claim 11, wherein the neutralizing step is performed such that substantially no side lobes are formed in the photoresist pattern.

17. The method of claim 11, wherein the alkaline gas has a density of approximately 20–40 ppb during the neutralizing step.

18. A method of forming a photoresist pattern without side lobes using a phase shifting mask, comprising:

transmitting a light of prescribed wavelength onto a photoresist on a substrate using the phase shifting mask to form exposed portions and non-exposed portions, wherein the exposed portions include regions for forming the photoresist pattern;

neutralizing hydrogen ions formed at undesired locations on the photoresist by exposing the photoresist to a gas for a predetermined period of time after the transmitting step; and removing the exposed portions of the photoresist.

19. The method of claim 18, wherein the gas is an alkaline gas having a concentration greater than 1 ppb.

20. The method of claim 19, wherein the alkaline gas concentration is approximately 20–40 ppb.

21. A method of forming a prescribed pattern, comprising the sequential steps of:

light-exposing portions of a photoresist layer positioned above the prescribed pattern to form exposed regions;

exposing the light exposed regions to a substance for a prescribed duration to neutralize an acid formed on areas of the photoresist layer; and forming the prescribed pattern by removing the exposed regions of the photoresist layer.

* * * * *